(12) United States Patent
Okada

(10) Patent No.: US 10,848,702 B2
(45) Date of Patent: Nov. 24, 2020

(54) SOLID-STATE IMAGING DEVICE

(71) Applicants: Kabushiki Kaisha Toshiba, Tokyo (JP); Toshiba Electronic Devices & Storage Corporation, Tokyo (JP)

(72) Inventor: Yutaka Okada, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/276,804

(22) Filed: Feb. 15, 2019

(65) Prior Publication Data
US 2020/0092503 A1    Mar. 19, 2020

(30) Foreign Application Priority Data
Sep. 13, 2018  (JP) ................................ 2018-171665

(51) Int. Cl.
*H04N 5/378* (2011.01)
*H04N 5/374* (2011.01)
*H04N 5/355* (2011.01)
*H01L 27/146* (2006.01)

(52) U.S. Cl.
CPC ....... *H04N 5/378* (2013.01); *H01L 27/14603* (2013.01); *H01L 27/14612* (2013.01); *H04N 5/3559* (2013.01); *H04N 5/374* (2013.01)

(58) Field of Classification Search
CPC ...... H04N 5/378; H04N 5/3559; H04N 5/374; H01L 27/14603; H01L 27/14612
See application file for complete search history.

(56) References Cited

U.S. PATENT DOCUMENTS

| 8,125,553 | B2 | 2/2012 | Mod et al. |
| 9,338,376 | B2 | 5/2016 | Nishikido |
| 2010/0176423 | A1* | 7/2010 | Sugawa ............ H01L 27/14603 257/225 |

FOREIGN PATENT DOCUMENTS

| JP | 2009-182405 A | 8/2009 |
| JP | 4470425 B2 | 6/2010 |
| JP | 4952601 B2 | 6/2012 |
| JP | 2013-179979 A | 9/2013 |
| JP | 6137997 B2 | 5/2017 |

* cited by examiner

*Primary Examiner* — Nicholas G Giles
(74) *Attorney, Agent, or Firm* — White & Case LLP

(57) ABSTRACT

A solid-state imaging device according to an embodiment includes: plural pixels, plural readout circuits, a control circuit, and a driving circuit. The plural pixels have light receiving elements. The plural readout circuits are connected to each of the plural pixels, and read out the charges accumulated by the light receiving elements. The control circuit gives a readout instruction to a readout pixel serving as a readout target out of the plural pixels. The driving circuit gives a driving instruction for driving a first constant current source provided in the readout circuit of the readout pixel and a second constant current source provided in a readout circuit of a corresponding pixel associated with the readout pixel out of the plural pixels.

9 Claims, 10 Drawing Sheets

US 10,848,702 B2

SOLID-STATE IMAGING DEVICE

CROSS REFERENCE TO RELATED APPLICATION

This application is based upon and claims the benefit of priority from the prior Japanese Patent Application No. 2018-171665 filed in Japan on Sep. 13, 2018; the entire contents of which are incorporated herein by reference.

FIELD

An embodiment described herein relates generally to a solid-state imaging device.

BACKGROUND

A solid-state imaging device having a pixel array in which plural pixels are arranged has been conventionally known. In the solid-state imaging device, a light receiving element such as a photodiode is provided in each pixel, and a captured image is generated based on a pixel signal acquired by each of the light receiving elements.

In the solid-state imaging device, the length of a signal output line connecting each pixel and a signal output terminal of the pixel array varies depending on the position of the pixel. When the length is different among the pixels, the signal output line also has different wiring resistance. When the wiring resistance is different, the linearity characteristic between the pixel and a source follower may vary, and a pixel signal output via the signal output line may also vary.

DETAILED DESCRIPTION

Embodiment

A solid-state imaging device according to an embodiment includes plural pixels, plural read-out circuits, a control circuit, and a driving circuit. The plural pixels have light receiving elements. The plural readout circuits are connected to each of the plural pixels, and read out charges accumulated by the light receiving elements. The control circuit gives a readout instruction to a readout pixel serving as a readout target out of the plural pixels. The driving circuit gives a driving instruction for driving a first constant current source provided in the readout circuit of the readout pixel and a second constant current source provided in a readout circuit of a corresponding pixel associated with the readout pixel out of the plural pixels.

An embodiment will be described below with reference to the drawings.

Figure 1:
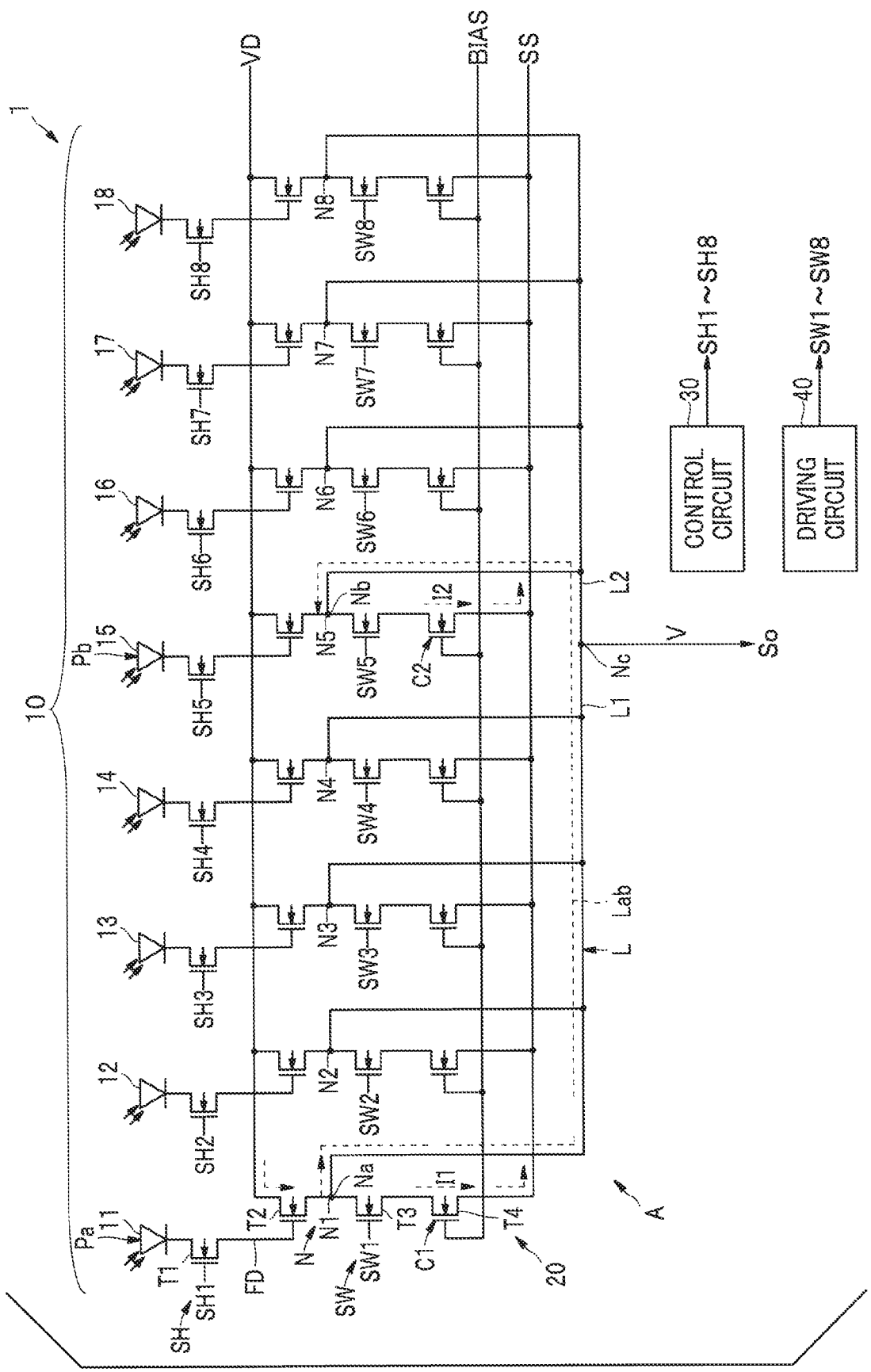
FIG. 1 is a circuit diagram showing an example of a schematic configuration of a solid-state imaging device according to an embodiment.

FIG. 1 is a circuit diagram showing an example of a schematic configuration of a solid-state imaging device 1. In FIG. 1 and the following description, pixels 10 represent all or a part of pixels 11 to 18, control signals SH represent all or a part of control signals SH1 to SH8, drive signals SW represent all or a part of drive signals SW1 to SW8, and readout nodes N represent all or a part of readout nodes N1 to N8. Furthermore, in FIG. 1, each of the pixels 10 is provided with a photodiode PD, a transfer transistor T1, a floating diffusion FD, a source follower input gate T2, a switching transistor T3 and a source follower constant current source transistor T4 to which reference signs are appended in the pixel 11, but are omitted in the pixels 12 to 18. The same is also applied to FIGS. 3, 4, 5, 7, 8 and 9.

The solid-state imaging device 1 includes plural pixels 10, a readout circuit 20, a control circuit 30, and a driving circuit 40. The solid-state imaging device 1 is, for example, a linear image sensor in which pixels are linearly arranged.

The plural pixels 10 include n pixels which are provided in a pixel array A in a horizontal direction. For the sake of explanation, an example in which the plural pixels 10 are configured of eight pixels 11 to 18 will be described with reference to FIG. 1, but the number of pixels is not limited to eight.

Each of the pixels 10 includes a photodiode PD as a light receiving element, a transfer transistor T1, and a floating diffusion FD). The transfer transistor T1 is configured of, for example, an n-type MOS transistor.

The photodiode PD receives external light, performs photoelectric conversion, and accumulates charges. A cathode of the photodiode PD is connected to a source of the transfer transistor T1.

A gate of the transfer transistor T1 is connected to the control circuit 30, and a drain of the transfer transistor T1 is connected to a gate of the source follower input gate T2. Each of the transfer transistors T1 provided in the plural pixels 10 reads out the charges accumulated in the photodiode PD in response to each of the control signals SH input from the control circuit 30, and transfers the read-out charges to the floating diffusion FD.

The floating diffusion FD is formed between the transfer transistor T1 and the source follower input gate T2, and charges are transferred from the photodiode PD to the floating diffusion FD. Furthermore, a reset transistor (not shown) is connected to the floating diffusion FD. The reset transistor connects the floating diffusion FD and a predetermined potential to each other at a predetermined timing, and resets the transferred charges. Note that a gate to which a fixed voltage (not shown) is applied may be further provided between the transfer transistor T1 and the floating diffusion FD.

The readout circuit 20 is connected to each of the plural pixels 10, and reads out the charges accumulated by the photodiode PD. The readout circuit 20 includes a source follower input gate T2, a switching transistor T3, and a source follower constant current source transistor T4. Each of the source follower input gate T2, the switching transistor T3, and the source follower constant current source transistor T4 is configured of, for example, an n-type MOS transistor.

A drain of the source follower input gate T2 is connected to a high potential VD, and a source of the source follower input gate T2 is connected to the switching transistor T3. The source follower input gate T2 performs a source follower operation, and outputs a potential corresponding to the potential of the floating diffusion FD to the source.

A gate of the switching transistor T3 is connected to the driving circuit 40, and a source of the switching transistor T3 is connected to a drain of the source follower constant current source transistor T4. Each of the switching transistors T3 provided in the plural pixels 10 is switched to either an ON-state or an OFF-state in response to each of the drive signals SW input from the driving circuit 40. When the switching transistor T3 is set to the ON-state, the source follower constant current source transistor T4 is set to be connected with the source follower input gate T2. When the switching transistor T3 is set to the OFF-state, the source follower constant current source transistor T4 falls into a cutoff state where the source follower constant current source transistor T4 is cut off from the source follower input gate T2.

A gate of the source follower constant current source transistor T4 is connected to a bias potential BIAS, and a source of the source follower constant current source transistor T4 is connected to a low potential SS. When set to be connected with the source follower input gate T2, the source follower constant current source transistor T4 supplies a constant current corresponding to the bias potential BIAS to the source follower input gate T2.

That is, the readout circuit 20 includes the source follower input gate T2 having the gate to which the pixel 10 is connected, and the switching transistor T3 and the source follower constant current source transistor T4 which are connected in series to the source follower input gate 12. The readout circuit 20 outputs a pixel signal V to the readout node N in response to a readout instruction and a drive instruction.

In each of the readout circuits 20, each of the readout nodes N is provided between the source follower input gate T2 and the switching transistor T3.

A signal output line L is connected to each of the readout nodes N. The signal output line L has a signal line L1 which is a first signal line, a signal line L2 which is a second signal line, and an output node Nc that outputs a pixel signal V. The signal line L1 connects each of the readout nodes N1, N2, N3, and N4 to the output node Nc. The signal line L2 connects each of the readout nodes N5, N6, N7, and N8 to the output node Nc. The output node Nc is connected to a signal output terminal So.

The control circuit 30 and the driving circuit 40 are configured of, for example, shift register circuits. Note that the control circuit 30 and the driving circuit 40 are not limited to the shift register circuits, but the functions of the control circuit 30 and the driving circuit 40 may be implemented by a processor executing a program.

The control circuit 30 gives a readout instruction to a readout pixel Pa serving as a readout target out of the plural pixels 10. More specifically, the control circuit 30 outputs a control signal SH to the readout pixel Pa out of the plural pixels 10 according to a predetermined order, and sets the transfer transistor T1 of the readout pixel Pa to the ON-state.

The driving circuit 40 outputs the drive signal SW to the readout circuit 20 of the readout pixel Pa out of the plural pixels 10 to set the switching transistor T3 to the ON-state. The switching transistor T3 of the readout circuit 20 of the readout pixel Pa drives the constant current source C1 which is the first constant current source.

Furthermore, the driving circuit 40 outputs the drive signal SW to the readout circuit 20 of a corresponding pixel Pb associated with the readout pixel Pa out of the plural pixels 10 to set the switching transistor T3 to the ON-state. The switching transistor T3 arranged in the readout circuit 20 of the corresponding pixel Pb drives a constant current source C2 which is the second constant current source.

That is, the driving circuit 40 gives driving instructions for driving the constant current source C1 provided in the readout circuit 20 of the readout pixel Pa, and the constant current source C2 provided in the readout circuit 20 of the corresponding pixel Pb associated with the readout pixel Pa out of the plural pixels 10.

Each of the constant current sources C1 and C2 has a source follower constant current source transistor T4 having a gate connected to a bias potential BIAS. In response to the driving instructions, the switching transistors T3 set the constant current sources C1 and C2 and the readout pixel Pa to be connected with one another. The constant current sources C1 and C2 are connected to each other via the signal output line L that outputs the pixel signal V from the readout pixel Pa.

When the constant current sources C1 and C2 are set to the ON-state, a current path Lab is formed between a readout node Na of the readout pixel Pa and a readout node Nb of the corresponding pixel Pb, the readout node Na and the readout node Nb being connected to each other via the signal output line L.

The corresponding pixel Pb is associated with the readout pixel Pa such that the output node Nc is arranged on the current path Lab formed between the corresponding pixel Pb and the readout pixel Pa.

Each corresponding pixel Pb is associated with a position on an opposite side of the readout pixel Pa with the output node Nc interposed between the corresponding pixel Pb and the readout pixel Pa so that the output node Nc is arranged on the current path Lab.

Furthermore, each corresponding pixels Pb is associated with the readout pixel Pa at a position spaced at a constant distance from the readout pixel Pa out of the plural pixels 10 so as to be capable of reducing variation of the length of the current path Lab when the readout pixel Pa shifts. Information on the association between the readout pixel Pa and the corresponding pixel Pb is stored in the driving circuit 40.

For example, in FIG. 1, the output node Nc is provided at a center portion in the arrangement direction of the plural pixels 10. The readout node Na is provided on one side in the arrangement direction with respect to the output node Nc, and is connected to the pixels 11, 12, 13, and 14 constituting a part of the plural pixels 10 by the signal line L1. Furthermore, the readout node Nb is provided on the other side in the arrangement direction with respect to the output node Nc, and is connected to the pixels 15, 16, 17, and 18 constituting the other part of the plural pixels 10 by the signal line L2.

Each of the pixels 11 to 18 serving as the readout pixel Pa is successively associated with each of the pixels 15, 16, 17, 18, 11, 12, 13, and 14 serving as the corresponding pixel Pb which are located on the opposite side to the pixels 11 to 18 with respect to the output node Nc, respectively.

(Operation)

Next, an operation of the solid-state imaging device 1 according to the embodiment will be described.

Figure 2:
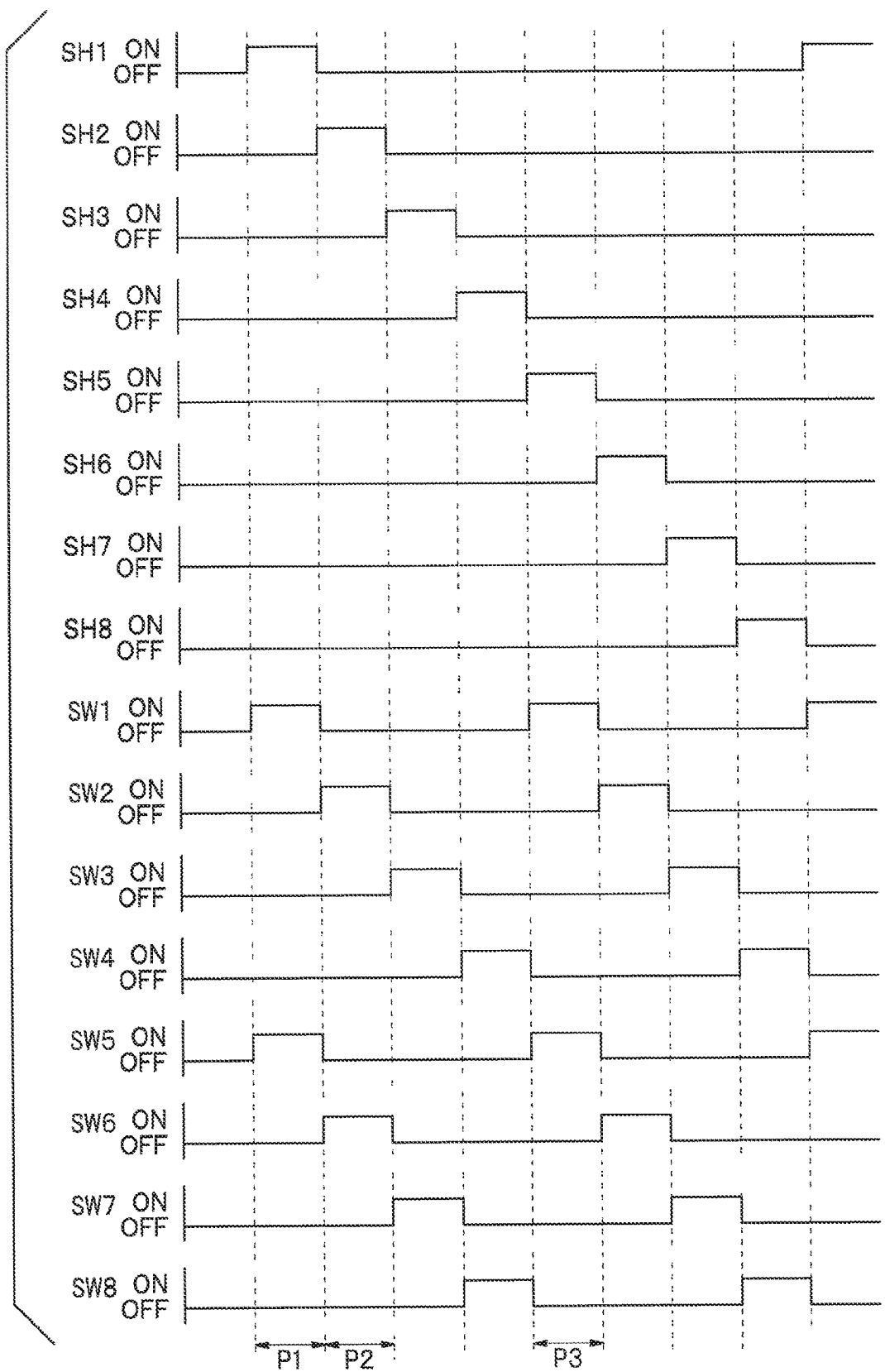
FIG. 2 is a waveform diagram showing examples of a control signal and a drive signal of the solid-state imaging device according to the embodiment.
Figure 3:
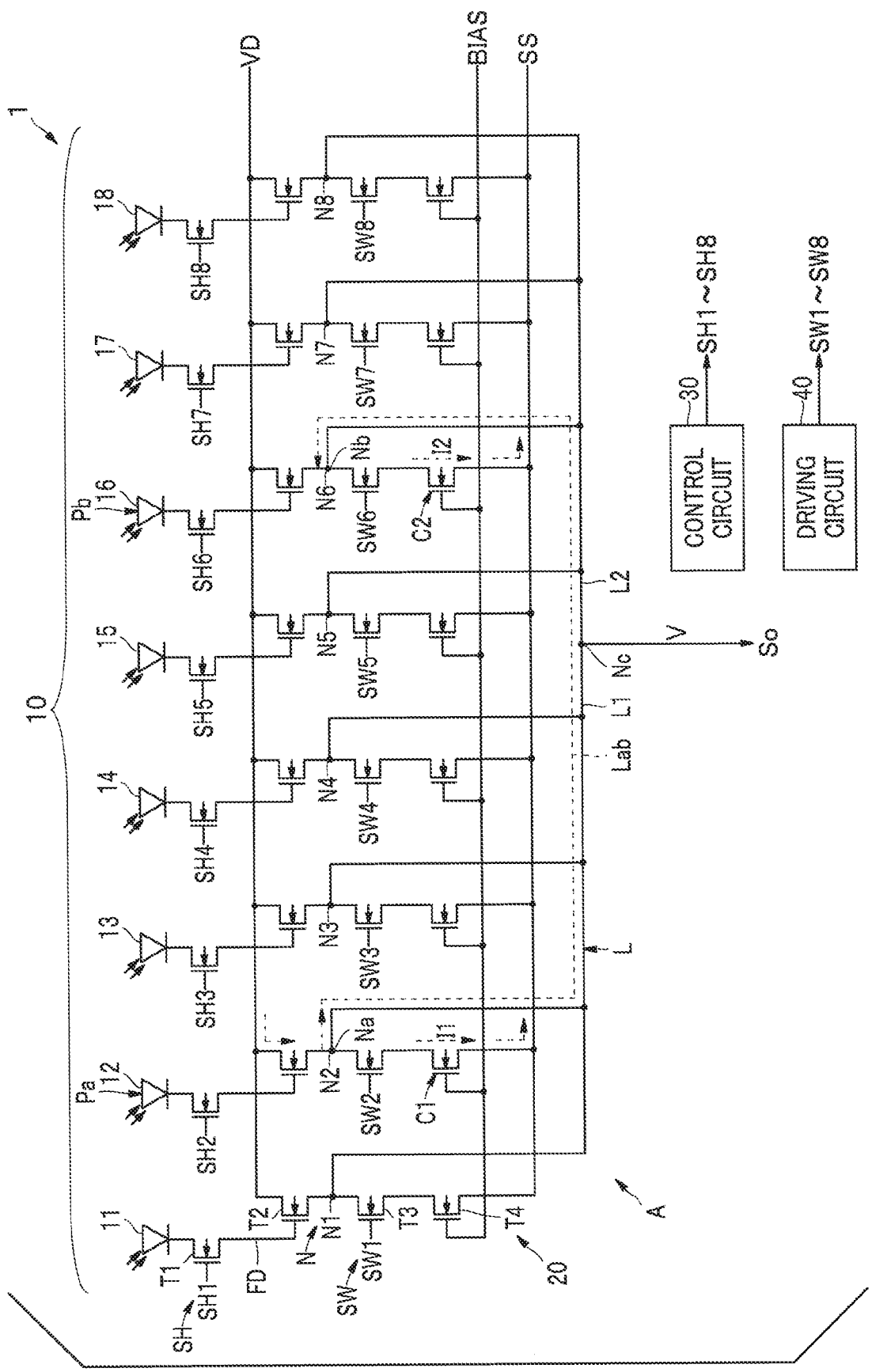
FIG. 3 is an explanatory diagram showing an example of an output operation of a pixel signal of the solid-state imaging device according to the embodiment.
Figure 4:
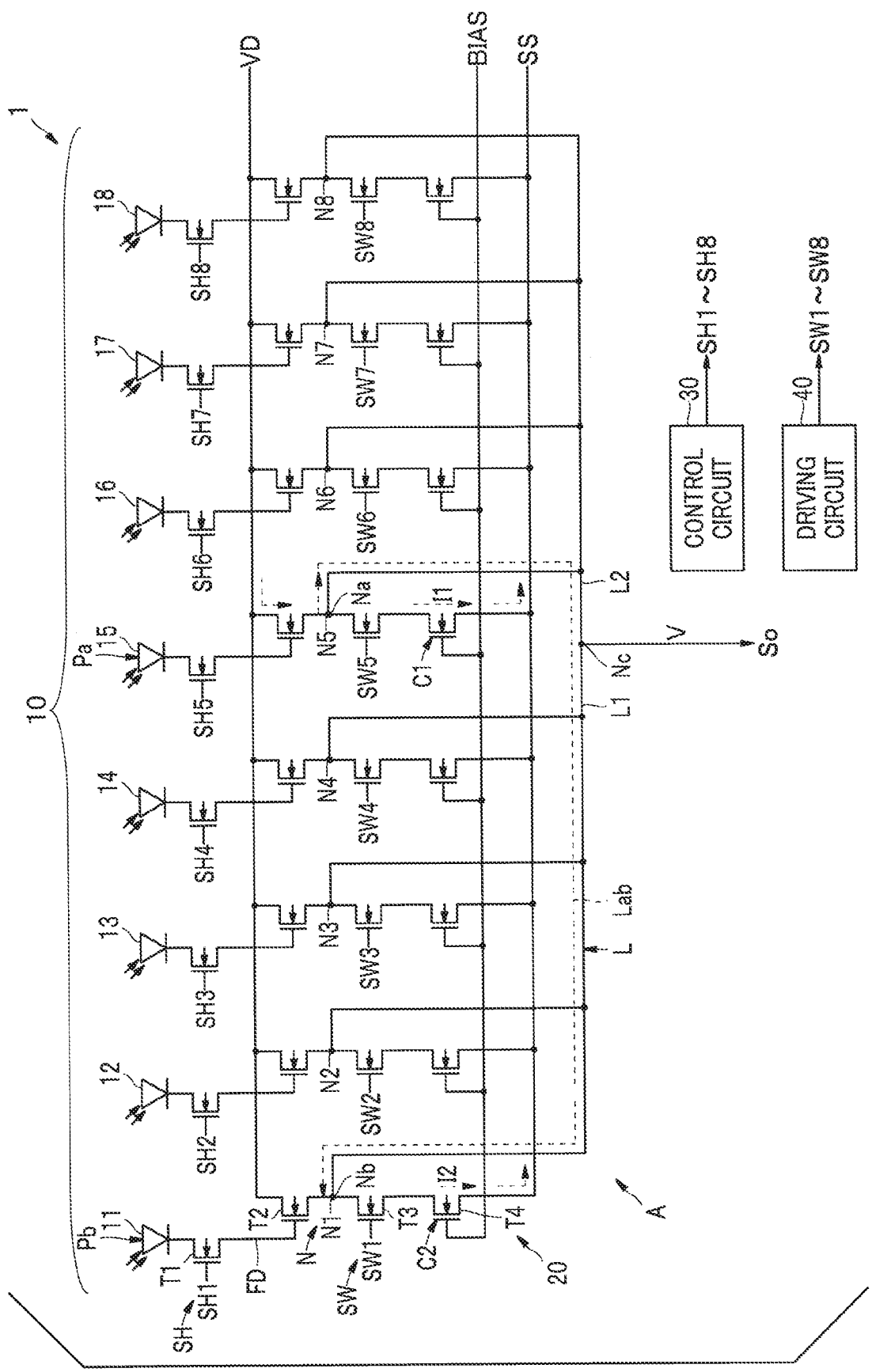
FIG. 4 is an explanatory diagram showing an example of the output operation of the pixel signal of the solid-state imaging device according to the embodiment.

FIG. 2 is a waveform diagram showing examples of the control signal SH and the drive signal SW of the solid-state imaging device 1. FIGS. 3 and 4 are explanatory diagrams showing an example of an output operation of the pixel signal V of the solid-state imaging device 1.

Upon receiving external light, the photodiode PD accumulates charges by photoelectric conversion.

In a period P1 of FIG. 2, the readout pixel Pa is the pixel 11, and the corresponding pixel Pb is the pixel 15. When the period P1 starts, the control circuit 30 gives a readout instruction to the pixel 11. Furthermore, the driving circuit 40 gives a driving instruction for driving the constant current source C to the readout circuit 20 of the pixel 11, and gives a driving instruction for driving the constant current source C2 to the readout circuit 20 of the pixel 15.

More specifically, the control circuit 30 outputs the control signal SH1 having an H level which instructs an ON-state. The transfer transistor T1 of the pixel 11 transfers accumulated charges from the photodiode PD to the floating diffusion FD.

The driving circuit 40 outputs the drive signal SW1 having an H level which instructs an ON-state. In the readout circuit 20 of the pixel 11, the switching transistor T3 is set to the ON-state, so that the source follower constant current source transistor T4 and the source follower input gate T2 are set to be connected with each other, and thus a constant current I1 flows into the constant current source C1.

Furthermore, the driving circuit 40 outputs the drive signal SW5 having the H level which instructs ON-state. In the readout circuit 20 of the pixel 15, the switching transistor T3 is set to the ON-state, so that the source follower constant current source transistor T4 and the source follower input gate T2 are set to be connected with each other, and a constant current I2 flows into the constant current source C2. A current path Lab is formed between the readout nodes N1 and N5.

The source follower input gate T2 of the readout circuit 20 of the pixel 11 performs a source follower operation, and outputs a potential corresponding to the potential of the floating diffusion FD to the readout node N1.

The potential of the readout node N1 is read out as a pixel signal V. The pixel signal V read out from the readout node N1 is output to the signal output terminal So via the output node Nc.

In a period P2, the readout pixel Pa is the pixel 12, and the corresponding pixel Pb is the pixel 16. When the period P2 starts, the control circuit 30 gives a readout instruction to the pixel 12. In addition, the driving circuit 40 gives a driving instruction for driving the constant current source C1 to the readout circuit 20 of the pixel 12, and gives a driving instruction for driving the constant current source C2 to the readout circuit 20 of the pixel 16.

More specifically, the control circuit 30 outputs the control signal SH1 which instructs an OFF-state. The driving circuit 40 outputs the drive signals SW and SW5 instructing an OFF-state. The pixel 11 stops the output of the pixel signal V.

Furthermore, the control circuit 30 outputs the control signal SH2 instructing an ON-state. The driving circuit 40 outputs the drive signals SW2 and SW6 instructing the ON-state.

As shown in FIG. 3, in the pixel 12 and the readout circuit 20 of the pixel 12, the transfer transistor T1 and the switching transistor T3 are set to the ON-state. In the readout circuit 20 of the pixel 16, the switching transistor T3 is set to the ON-state. When the constant current I1 flows into the constant current source C1 in the readout circuit 20 of the pixel 12 and the constant current I2 flows into the constant current source C2 in the readout circuit 20 of the pixel 16, the readout node N2 outputs a pixel signal V to the signal output terminal So.

In a period P3, the readout pixel Pa is the pixel 15, and the corresponding pixel Pb is the pixel 11. When the period P3 starts, the control circuit 30 gives a readout instruction to the pixel 15. In addition, the driving circuit 40 gives a driving instruction for driving the constant current source C1 to the readout circuit 20 of the pixel 15, and gives a driving instruction for driving the constant current source C2 to the readout circuit 20 of the pixel 11.

As shown in FIG. 4, when the constant current I1 flows into the constant current source C1 in the pixel 15 and the constant current I2 flows into the constant current source C2 in the pixel 1, the readout node N5 outputs a pixel signal V to the signal output terminal So.

When the readout pixel Pa shifts, the corresponding pixel Pb also shifts, so that the length of the current path Lab is kept substantially constant. For example, the respective lengths of the current paths Lab between the readout nodes N1 and N5 in the period P1, between the readout nodes N2 and N6 in the period P2, and between the readout nodes N6 and N1 in the period P3 are kept to a substantially constant length.

As a result, in the solid-state imaging device 1, even when the readout pixel Pa shifts among the plural pixels 10, the length of the current path Lab between the readout pixel Pa and the corresponding pixel Pb is kept substantially constant, the variation in the wring resistance of the signal output line L is suppressed, and the variation in the linearity characteristic of the pixel 10 and the source follower is also suppressed.

According to the embodiment, the solid-state imaging device 1 can more greatly suppress the variation of the pixel signal V caused by the difference in position among the pixels 10.

First Modification

In the embodiment, the output node Nc is provided at the center portion in the horizontal direction of the pixel array A, but the embodiment is not limited to this arrangement. For example, the output node Nc may be provided on one site or the other site in the horizontal direction of the pixel array A.

Figure 5:
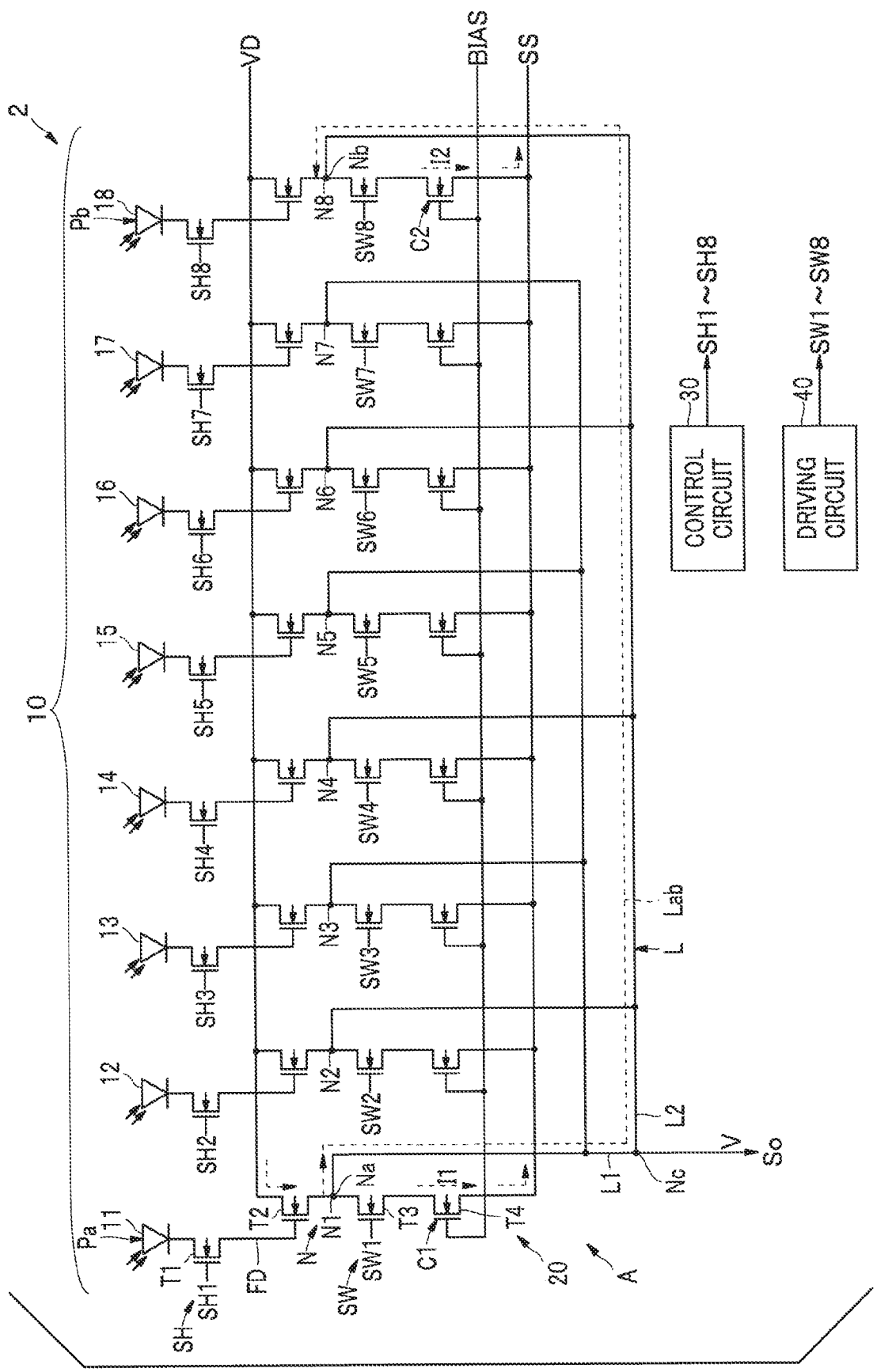
FIG. 5 is a circuit diagram showing an example of a schematic configuration of a solid-state imaging device according to a first modification of the embodiment.

FIG. 5 is a circuit diagram showing an example of a schematic configuration of a solid-state imaging device 2 according to a first modification of the embodiment. In the first modification, descriptions on the same components as in the embodiment and other modifications are omitted.

The output node Nc is provided on one site or the other site in the arrangement direction of the plural pixels 10. In the example of FIG. 5, the output node Nc is provided on a left portion in the arrangement direction of the plural pixels 10. Among the plural pixels 10, the pixels 11, 13, 15, and 17 which constitute a part of the plural pixels 10 and are located at odd-numbered positions from the one side are connected to the output node Nc via a signal line L1, and the pixels 12, 14, 16, and 18 which constitute the other part of the plural pixels 10 and are located at even-numbered positions from the one side are connected to the output node Nc via a signal line L2.

Next, an operation of the solid-state imaging device 2 of the first modification will be described.

Figure 6:
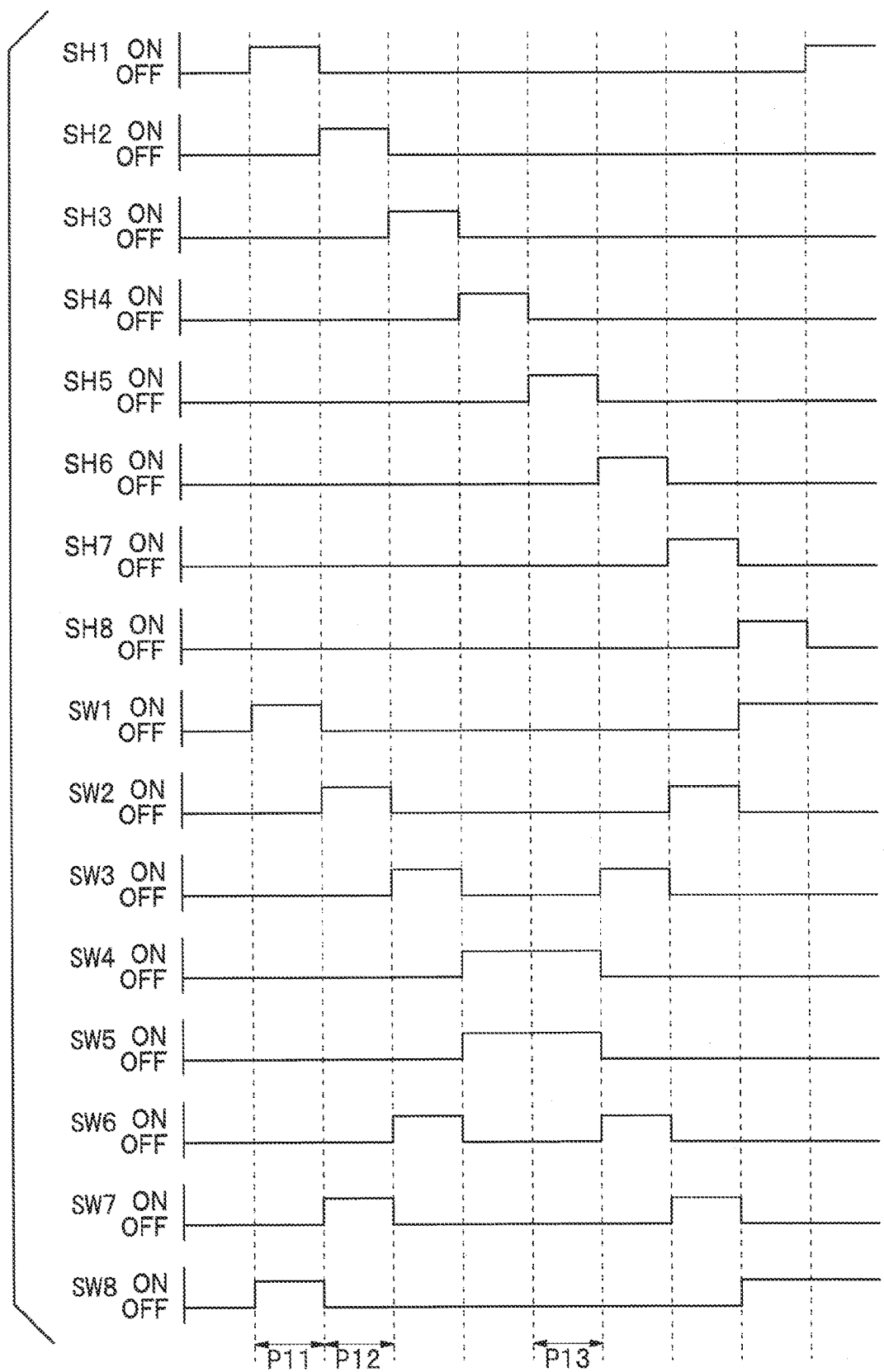
FIG. 6 is a waveform diagram showing examples of a control signal and a drive signal of the solid-state imaging device according to the first modification of the embodiment.
Figure 7:
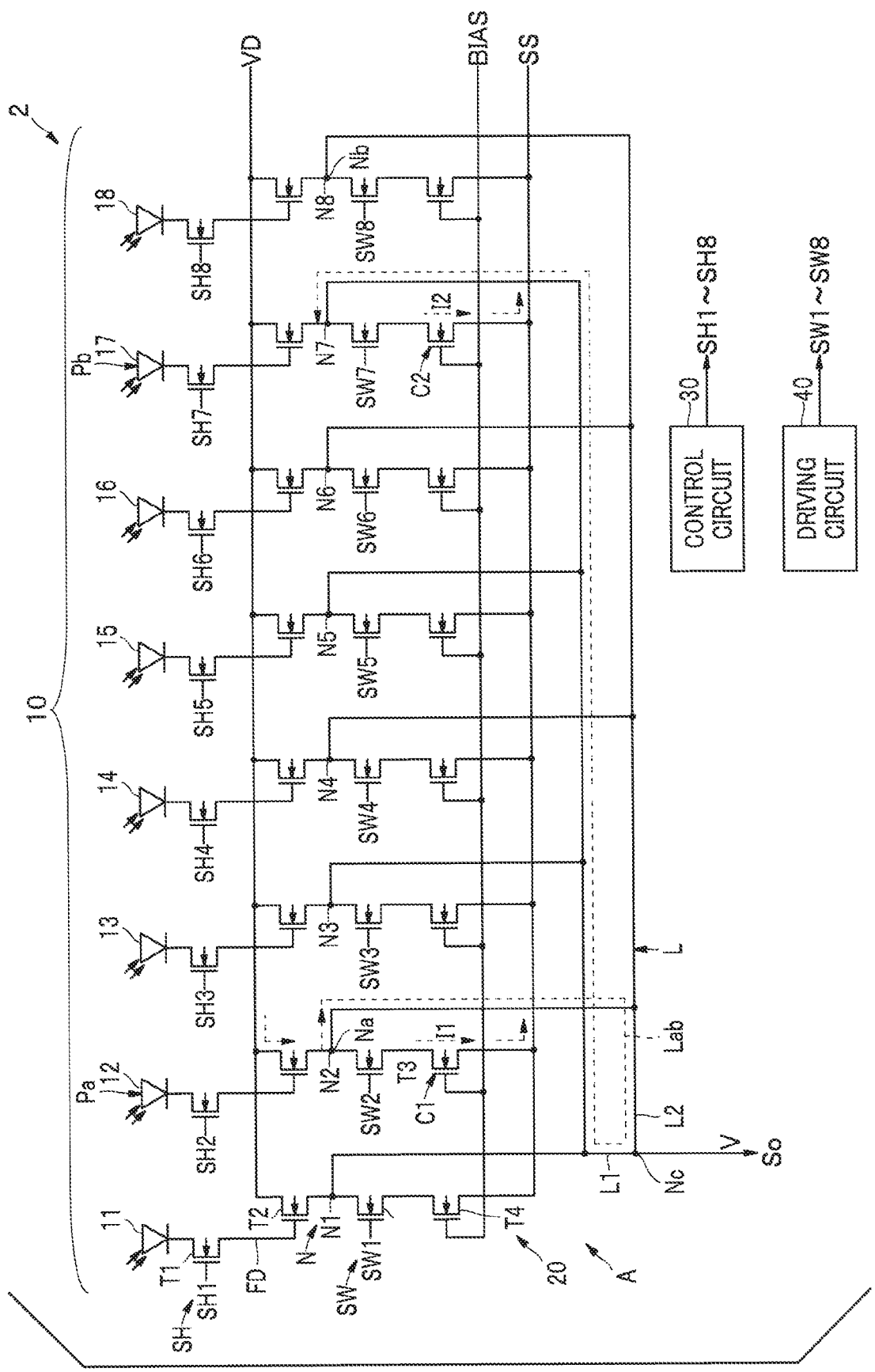
FIG. 7 is an explanatory diagram showing an example of an output operation of a pixel signal of the solid-state imaging device according to the first modification of the embodiment.
Figure 8:
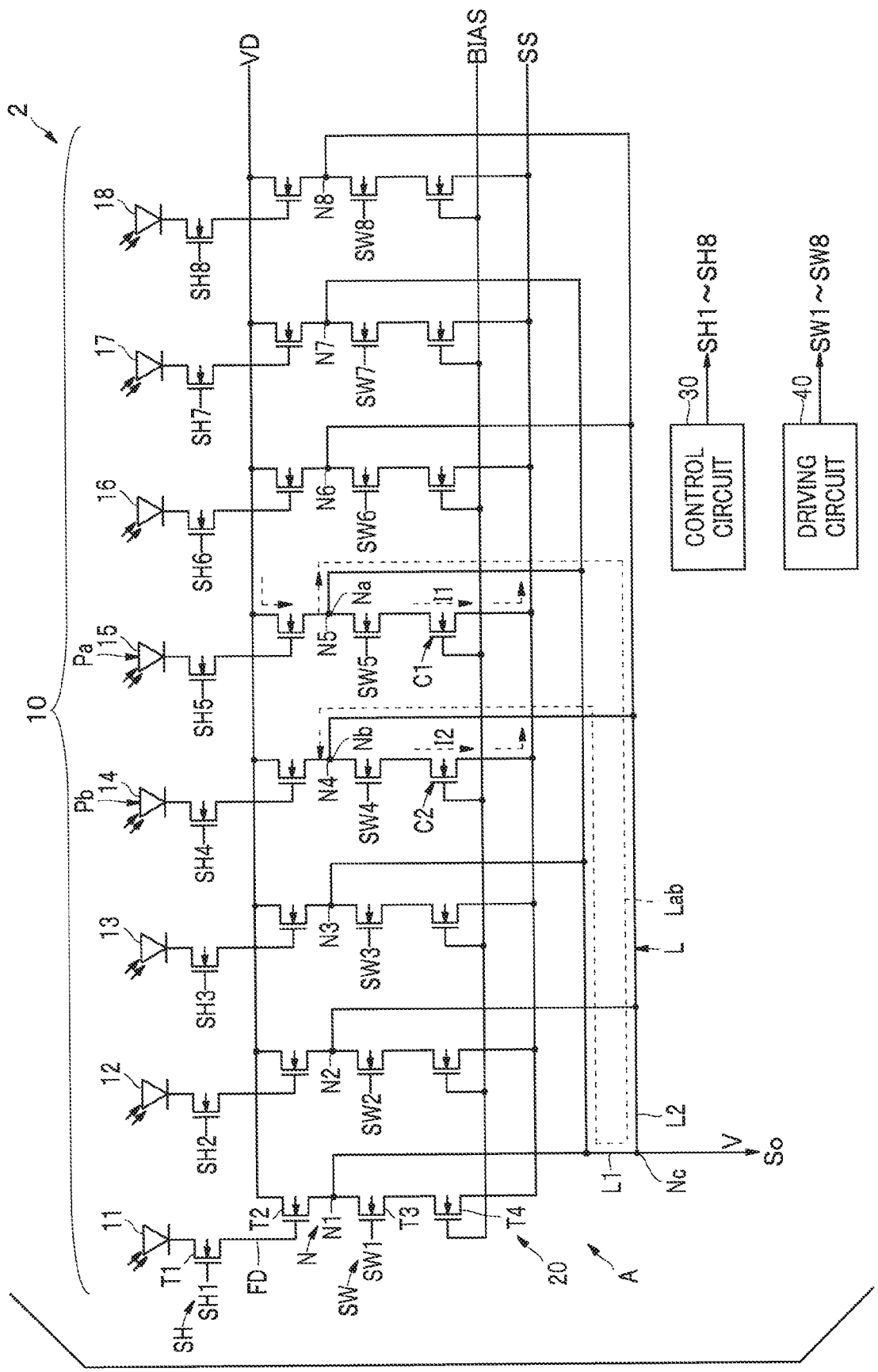
FIG. 8 is an explanatory diagram showing an example of the output operation of the pixel signal of the solid-state imaging device according to the first modification of the embodiment.

FIG. 6 is a waveform diagram showing an example of the control signal SH and the drive signal SW of the solid-state imaging device 2 according to the first modification. FIGS. 7 and 8 are explanatory diagrams showing an example of an output operation of a pixel signal V of the solid-state imaging device 2 according to the first modification.

In a period P11 of FIG. 6, the readout pixel Pa is the pixel 11, and the corresponding pixel Pb is the pixel 18. When the period P11 starts, the control circuit 30 outputs the control signal SH1 instructing the ON-state. Furthermore, the driving circuit 40 outputs the drive signals SW 1 and SW 8 instructing the ON-state.

In the pixel 11 and the readout circuit 20 of the pixel 11, the transfer transistor T1 and the switching transistor T3 are set to the ON-state. In the readout circuit 20 of the pixel 18, the switching transistor T3 is set to the ON-state. The readout nodes N1 and N8 are connected to each other via a current path Lab. When the constant current I1 flows into the constant current source C1 in the pixel 11 and the constant current I2 flows into the constant current source C2 in the pixel 18, the readout node N1 outputs a pixel signal V to the signal output terminal So via the output node Nc.

In a period P12, the readout pixel Pa is the pixel 12 and the corresponding pixel Pb is the pixel 17. When the period P12 starts, the control circuit 30 outputs the control signal SH2 instructing the ON-state. Furthermore, the driving circuit 40 outputs the drive signals SW2 and SW7 instructing the ON-state.

As shown in FIG. 7, the readout nodes N2 and N7 are connected to each other via a current path Lab. The readout node N2 outputs a pixel signal V to the signal output terminal So via the output node Nc.

In a period P13, the readout pixel Pa is the pixel 15, and the corresponding pixel Pb is the pixel 14. When the period P13 starts, the control circuit 30 outputs the control signal SH5 instructing the ON-state. Furthermore, the driving circuit 40 outputs the drive signals SW5 and SW4 instructing the ON-state.

As shown in FIG. 8, the readout nodes N5 and N4 are connected to each other via a current path Lab. The readout node N5 outputs a pixel signal V to the signal output terminal So via the output node Nc.

In the first modification, when the readout pixel Pa shifts, the corresponding pixel Pb also shifts, and the length of the current path Lab is kept substantially constant. For example, the respective lengths of the current paths Lab between the readout nodes N1 and N8 in the period P11, between the readout nodes N2 and N7 in the period P2, and between the readout nodes N5 and N4 in the period P3 are kept to a substantially constant length.

According to the first modification, the solid-state imaging device 2 can more greatly suppress the variation of the pixel signal V caused by the difference in position among the pixels 10.

Second Modification

In the embodiment and the first modification, the source follower input gate T2 and the readout node N are connected to each other, but a switch gate T5 may be provided between the source follower input gate T2 and the readout node N.

Figure 9:
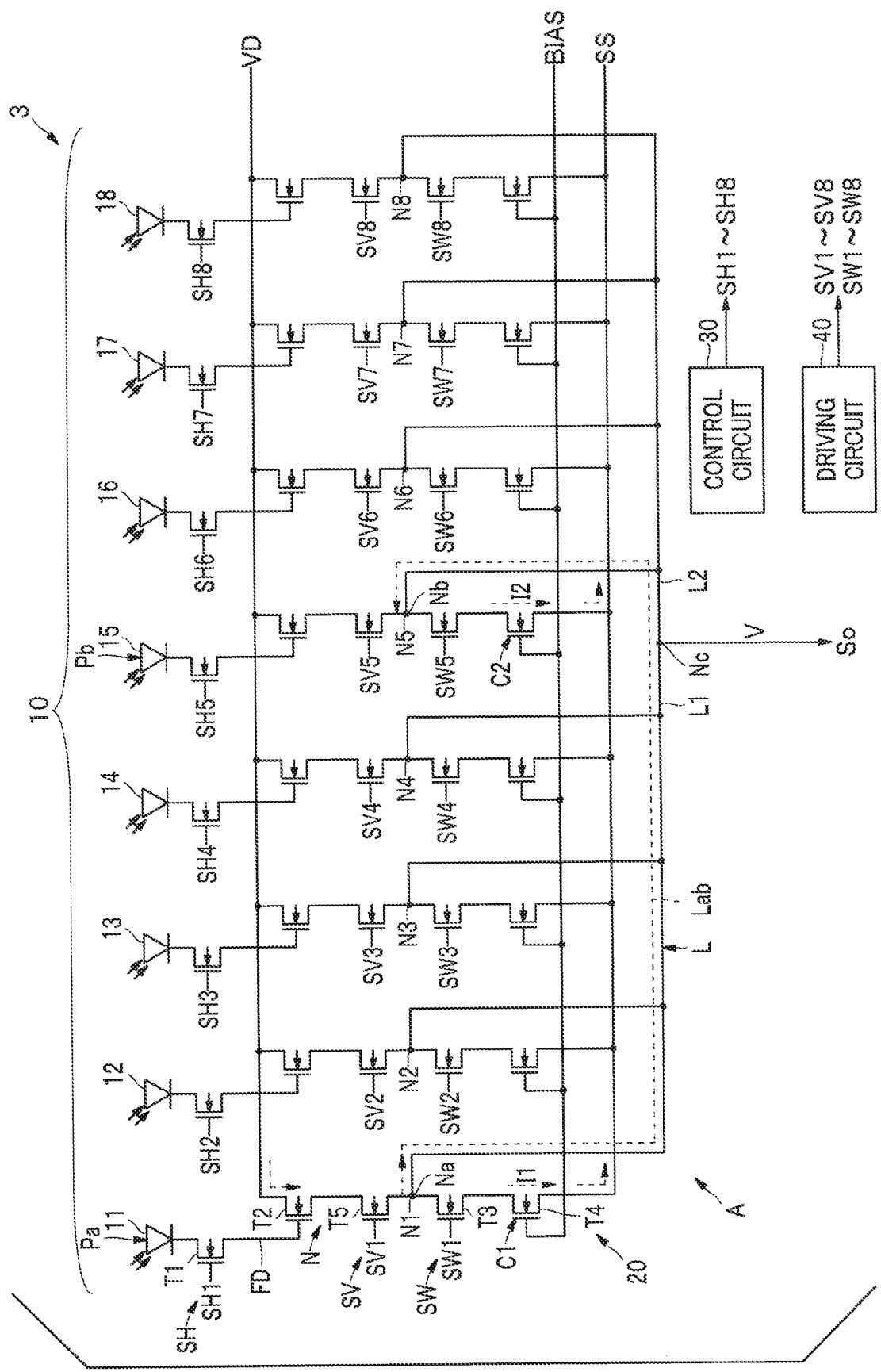
FIG. 9 is a circuit diagram showing an example of a schematic configuration of a solid-state imaging device according to a second modification of the embodiment.

FIG. 9 is a circuit diagram showing an example of a schematic configuration of a solid-state imaging device 3 according to a second modification of the embodiment. In FIG. 9 and the following description, a drive signal SV represents all or a part of drive signals SV1 to SV8. In the second modification, descriptions of the same components as in the embodiment and other modifications are omitted.

As shown in FIG. 9, the solid-state imaging device 3 includes a switch gate T5 in addition to the components of the solid-state imaging device 1.

The switch gate T5 is configured of, for example, an n-type MOS transistor. The switch gate T5 is provided between the source follower input gate T2 and the readout node N. A gate of the switch gate T5 is connected to the driving circuit 40, and the drive signal SV is input to the switch gate T5. When the switch gate T5 is set to the ON-state, the source follower input gate T2 is set to be connected with the readout node N. When the switch gate T5 is set to the OFF-state, the source follower input gate T2 is set to be cut off from the readout node N.

The driving circuit 40 outputs the drive signal SV to the readout circuit 20 of the readout pixel Pa out of the plural pixels 10 to set the switch gate T5 to the ON-state and also set the switch gates T5 of the readout circuits 20 other than the readout circuit 20 of the readout pixel Pa to the OFF-state.

Next, an operation of the solid-state imaging device 3 according to the second modification will be described.

Figure 10:
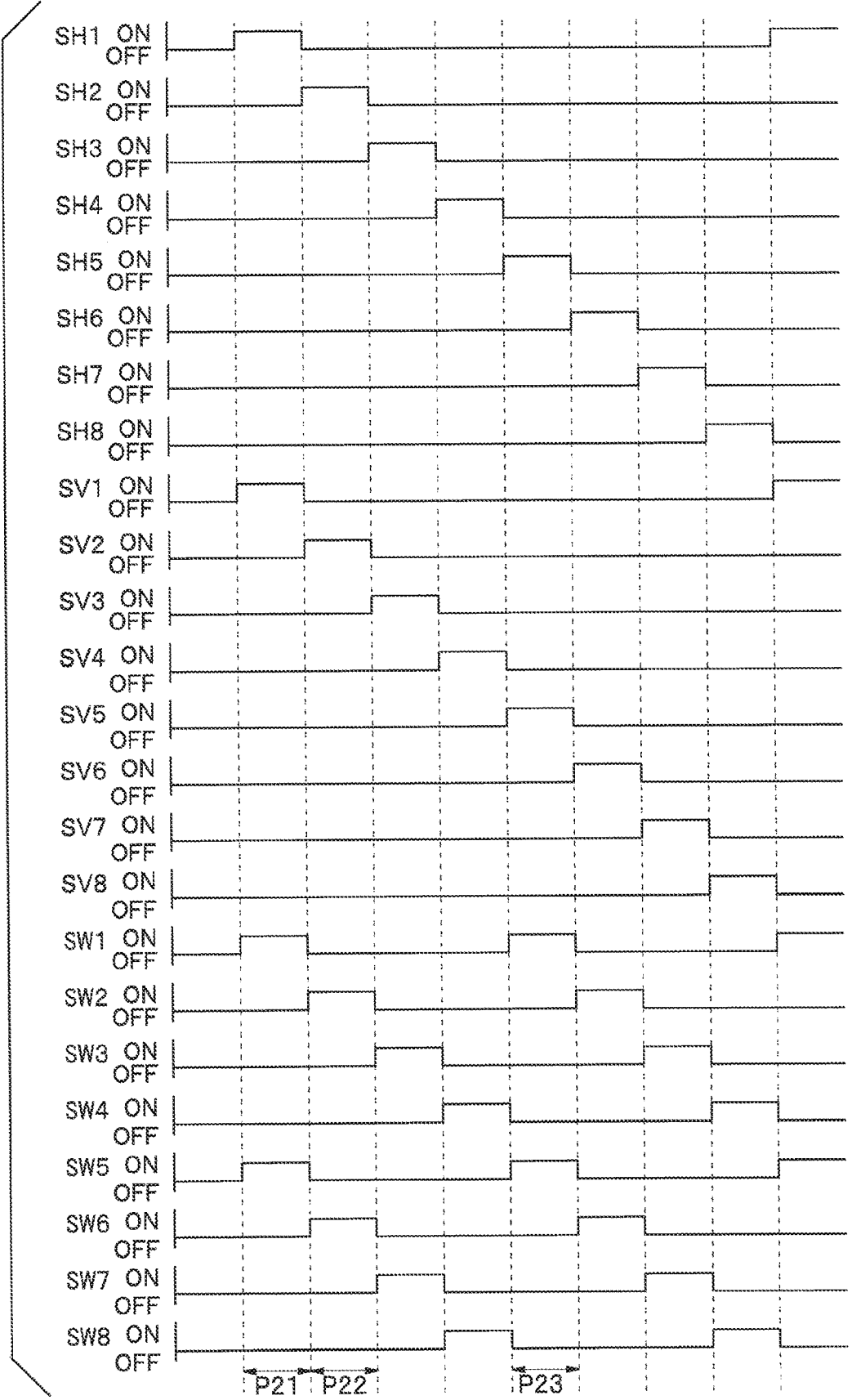
FIG. 10 is a waveform diagram showing examples of a control signal and a drive signal of the solid-state imaging device according to the second modification of the embodiment.

FIG. 10 is a waveform diagram showing examples of a control signal SH and drive signals SV and SW of the solid-state imaging device 3.

In a period P21 of FIG. 10, the readout pixel Pa is the pixel 11, and the corresponding pixel Pb is the pixel 15. When the period P21 starts, the control circuit 30 outputs a control signal SH1 instructing the ON-state. Furthermore, the driving circuit 40 outputs the drive signals SV1, SW1, and SW5 instructing the ON-state.

In the pixel 11 and the readout circuit 20 of the pixel 11, the transfer transistor T1, the switching transistor 13 and the switch gate 15 are set to the ON-state. In the readout circuit 20 of the pixel 15, the switching transistor T3 is set to the ON-state. In the readout circuit 20 of the pixel 15, the switch gate T5 is set to the OFF-state, and the source follower input gate T2 and the read node N5 are cut off from each other. The readout nodes N1 and N5 are connected to each other via a current path Lab. The readout node N1 outputs a pixel signal V to the signal output terminal So via the output node Nc.

In a period P22, the read pixel Pa is the pixel 12, and the corresponding pixel Pb is the pixel 16. When the period P22 starts, the control circuit 30 outputs the control signal SH2 instructing the ON-state. Furthermore, the driving circuit 40 outputs the drive signals SV2, SW2, and SW6 instructing the ON-state. When the readout nodes N2 and N6 are connected to each other via a current path Lab, the signal output terminal So outputs a pixel signal V.

In a period P23, the read pixel Pa is the pixel 15, and the corresponding pixel Pb is the pixel 11. When the period P23 starts, the control circuit 30 outputs the control signal S15 instructing the ON-state. Furthermore, the driving circuit 40 outputs the drive signals SW5, SV5, and SW1 instructing the ON-state. When the readout nodes N5 and N1 are connected to each other via a current path Lab, the signal output terminal So outputs a pixel signal V.

As a result, the switch gate T5 cuts off the source follower input gate T2 of the corresponding pixel Pb and the readout node N5 from each other, and suppresses decrease of the gain of the pixel signal V.

According to the second modification, the solid-state imaging device 3 can suppress the decrease of the gain of the pixel signal V, and can more greatly suppress the variation of the pixel signal V caused by the difference in position among the pixels 10.

Note that in the embodiment and the modifications, the examples in which the solid-state imaging devices 1 and 2 are linear image sensors have been described, but the embodiment and the modifications are not limited to these examples. The solid-state imaging devices 1 and 2 may be area image sensors in which plural pixels 10 are two-dimensionally arranged.

Note that in the embodiment and the modifications, the examples in which each of the transfer transistor T1, the source follower input gate T2, the switching transistor T3, the source follower constant current source transistor T4, and the switch gate T5 is configured of an n-type MOS transistor have been described. However, each of the transfer transistor T1, the source follower input gate T2, the switching transistor T3, the source follower constant current source transistor T4, and the switch gate T5 may be configured of a p-type MOS transistor.

While certain embodiments have been described, these embodiments have been, presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A solid-state imaging device comprising:
a plurality of pixels including light receiving elements;
a plurality of readout circuits that are connected to each of the plurality of pixels and configured to read out charges accumulated by the light receiving elements;
a control circuit configured to give a readout instruction to a readout pixel serving as a readout target out of the plurality of pixels; and
a driving circuit configured to give a driving instruction for driving a first constant current source provided in the readout circuit of the readout pixel, and a second constant current source provided in the readout circuit of a corresponding pixel associated with the readout pixel out of the plurality of pixels,
wherein the first constant current source and the second constant current source are connected to each other via a signal output line that outputs a pixel signal from the readout circuit.

2. The solid-state imaging device according to claim 1, wherein the corresponding pixel is associated at a position spaced at a predetermined distance from the readout pixel out of the plurality of pixels, and the driving circuit stores association information between the readout pixel and the corresponding pixel.

3. The solid-state imaging device according to claim 1, wherein the signal output line includes an output node configured to output the pixel signal, and the corresponding pixel is associated with the readout pixel such that the output node is arranged on a current path formed between the corresponding pixel and the readout pixel.

4. The solid-state imaging device according to claim 3, wherein the output node is provided at a center portion in an arrangement direction of the plurality of pixels, connected via a first signal line to a part of the plurality of pixels that is provided on one side in the arrangement direction with respect to the output node, and connected via a second signal line to another part of the plurality of pixels that is provided on another side in the arrangement direction with respect to the output node.

5. The solid-state imaging device according to claim 3, wherein the output node is provided at one site or another site in the arrangement direction of the plurality of pixels, connected via a first signal line to a part of the plurality of pixels that is located at an odd-numbered position from the one site, and connected via a second signal line to another part of the plurality of pixels that is located at an even-numbered position from the one site.

6. The solid-state imaging device according to claim 1, wherein the readout circuit outputs a pixel signal in response to the readout instruction and the driving instruction.

7. The solid-state imaging device according to claim 1, wherein the readout circuit includes a source follower input gate having a gate connected to each of the plurality of pixels, and a switching transistor and a source follower constant current source transistor that are connected in series to the source follower input gate.

8. The solid-state imaging device according to claim 1, further comprising a switching transistor, wherein the switching transistor sets the first constant current source and the second constant current source to be connected with the readout pixel in response to the driving instruction.

9. The solid-state imaging device according to claim 1, wherein each of the first constant current source and the second constant current source includes a source follower constant current source transistor having a gate connected to a bias potential.

* * * * *